(12) United States Patent
Buhler

(10) Patent No.: US 8,776,361 B2
(45) Date of Patent: Jul. 15, 2014

(54) MOUNTING SYSTEM FOR APPLYING AN RFID CHIP MODULE TO A SUBSTRATE, IN PARTICULAR A LABEL

(75) Inventor: Stefan Buhler, Danikon (CH)

(73) Assignee: Textilma AG (CH)

( * ) Notice: Subject to any disclaimer, the term of this patent is extended or adjusted under 35 U.S.C. 154(b) by 54 days.

(21) Appl. No.: 13/261,392

(22) PCT Filed: Nov. 30, 2010

(86) PCT No.: PCT/EP2010/068570
§ 371 (c)(1),
(2), (4) Date: Dec. 7, 2012

(87) PCT Pub. No.: WO2011/095241
PCT Pub. Date: Aug. 11, 2011

(65) Prior Publication Data
US 2013/0074327 A1 Mar. 28, 2013

(30) Foreign Application Priority Data
Feb. 6, 2010 (EP) .................................... 10001244

(51) Int. Cl.
B23P 19/00 (2006.01)
G06K 19/077 (2006.01)
H05K 13/04 (2006.01)

(52) U.S. Cl.
CPC .......... *H05K 13/04* (2013.01); *G06K 19/07718* (2013.01); *G06K 19/07749* (2013.01)
USPC ................ 29/729; 29/739; 29/600; 29/592.1; 343/700 MS

(58) Field of Classification Search
USPC ................ 29/600, 601, 729, 739, 592.1, 827, 29/830–832; 343/700 MS; 156/291, 156/230–239; 83/12; 340/572.1–572.7
See application file for complete search history.

(56) References Cited

U.S. PATENT DOCUMENTS

| | | | | |
|---|---|---|---|---|
| 4,790,895 A * | 12/1988 | Matsuo | ......................... | 156/353 |
| 4,964,937 A * | 10/1990 | Seki | ............................... | 156/250 |
| 5,082,439 A * | 1/1992 | Kaminski | ...................... | 425/504 |
| 5,656,115 A * | 8/1997 | Tanno et al. | .................. | 156/270 |
| 6,099,678 A * | 8/2000 | Kotato et al. | ................. | 156/256 |

(Continued)

FOREIGN PATENT DOCUMENTS

| | | |
|---|---|---|
| JP | 2000-216-200 A | 8/2000 |
| JP | 2006-156-880 A | 6/2006 |
| JP | 2007 108-983 A | 4/2007 |
| WO | WO 2006/058324 A1 | 6/2006 |

*Primary Examiner* — Minh Trinh
(74) *Attorney, Agent, or Firm* — George Pappas

(57) ABSTRACT

A mounting system for applying an RFID chip module having at least one electrical connection to a substrate having at least one conductor, in particular a label. The system includes a stamping device for stamping out the RFID chip module from a carrier strip having a plurality of chip modules. The stamping device comprises a stamping die having a stamping opening, by which an RFID chip module to be stamped out is received with accurate positioning, and a stamping punch is disposed above the stamping opening A support for receiving a substrate with accurate positioning is disposed below the stamping opening and the stamping punch can be moved up against the substrate. A suction device is provided for holding the RFID chip module on the stamping punch. A heating device for melting solder is present on the RFID chip module in order to establish a conductive connection between an electrical connection of the RFID chip module and a conductor of the substrate.

13 Claims, 4 Drawing Sheets

(56) References Cited

U.S. PATENT DOCUMENTS

| | | | |
|---|---|---|---|
| 8,246,773 B2 * | 8/2012 | Green et al. | 156/265 |
| 8,397,377 B2 * | 3/2013 | Lolli | 29/748 |
| 2003/0136503 A1 | 7/2003 | Green et al. | |
| 2004/0192011 A1 | 9/2004 | Roesner | |
| 2006/0026819 A1 | 2/2006 | Kurz | |
| 2010/0181382 A1 | 7/2010 | Speich | |

* cited by examiner ial field of application
can be used unrestrictedly.

MOUNTING SYSTEM FOR APPLYING AN RFID CHIP MODULE TO A SUBSTRATE, IN PARTICULAR A LABEL

The application claims priority of PCT application PCT/EP2010/068570 having a priority date of Feb. 6, 2010, the disclosure of which is incorporated herein by reference.

FIELD OF THE INVENTION

The invention relates to a mounting device for attaching an RFID chip module to a substrate, particularly onto a label.

BACKGROUND OF THE INVENTION

Prior Art

In order to provide substrates with at least one conductor, particularly to provide labels with RFID transponder chips, it has proven advantageous—as shown in WO 2009/003299 A1—to initially place such RFID transponder chips onto RFID chip modules the connections of which are provided with a soldering means. These RFID chip modules then need to be attached in a convenient manner onto a stripe of prefabricated substrates such as labels, particularly textile labels. For example, such conductors are printed onto, woven into, sewn into the substrates, or likewise. Such conductors are, for example, antenna conductors for the RFID chip modules. The RFID chip modules are connected to the conductor at the location thereof where the soldering means is arranged by melting said soldering means. However, this type of mounting appears to be complicated and laborious.

SUMMARY OF THE INVENTION

Therefore, the object of the invention is to provide a mounting device that allows to simplify the above mentioned mounting process and also to improve the precision thereof.

The invention solves the above mentioned task by means of a mounting device. Hereby the measures of the invention primarily have the result that, on the one hand, the various functions of the inventive mounting device allow for a simplification while, on the other hand, a higher accuracy of the manufacturing process is also achieved.

The inventive mounting device is particularly advantageous if the suction device comprises a punching aperture arranged at the punching side of the punching die. For applying underpressure by means of a suction line, the punching aperture is connected to the suction device, preferably to a suction pump.

Furthermore, it is very advantageous if the heating device comprises hot spots formed at the punching side of the punching die. The hot spots can be configured, for example, as apertures at the punching side of the punching die, through which apertures a laser beam impinges on the RFID chip module at the locations thereof provided with soldering means. The hot spots can be configured as thermodes which preferably can be fed towards the soldering area and retracted therefrom through guide channels formed in the punching die and which are supplied with heat by means of a laser or a heating cartridge.

The aforementioned elements to be used according to the invention, as well as those claimed and described in the following exemplary embodiments, are not subject to any particular conditions by way of exclusion in terms of their size, shape, choice of material and technical design, so that the selection criteria known in the respective field of application can be used unrestrictedly.

BRIEF DESCRIPTION OF THE DRAWINGS

Examples of the invention will henceforth be described in more detail by reference to drawings, wherein are shown.

DETAILED DESCRIPTION OF THE PREFERRED EMBODIMENTS

Figure 1:
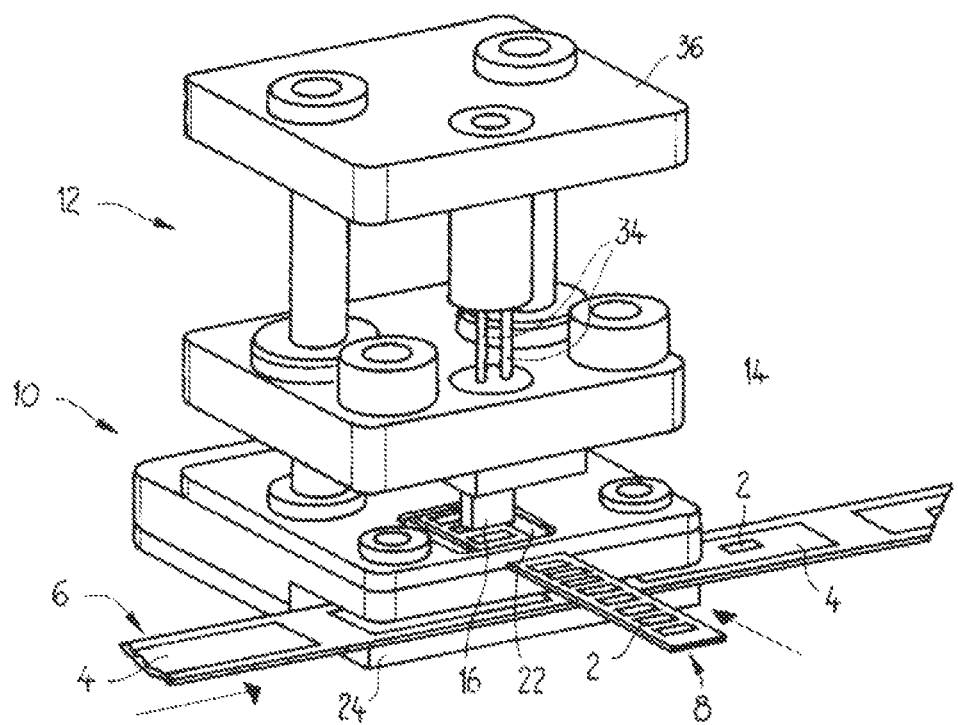
FIG. 1 a mounting device for attaching an RFID chip module onto a label, in a pictorial representation.
Figure 2:
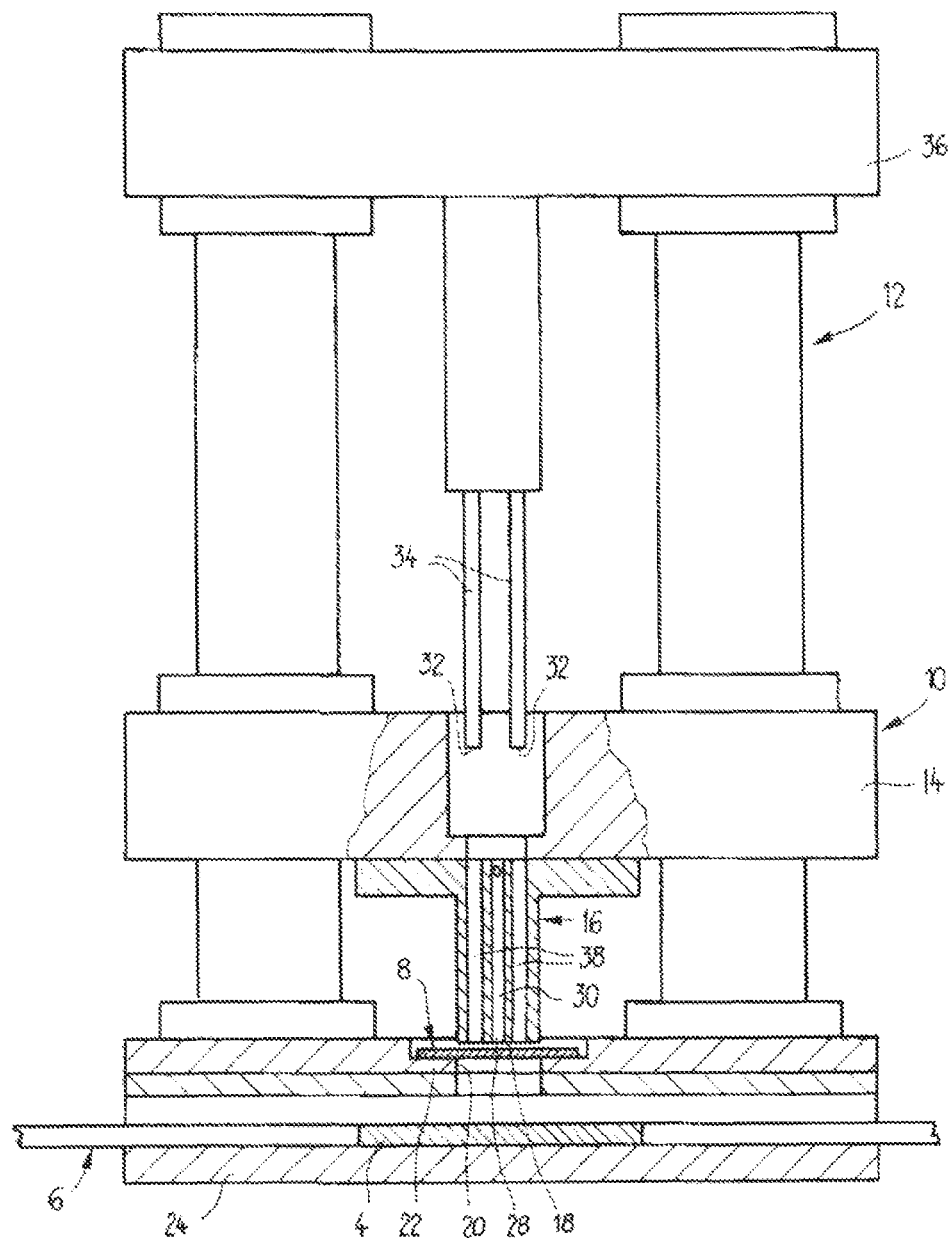
FIG. 2 the mounting device according to FIG. 1 in starting position, in a vertical section.
Figure 3:
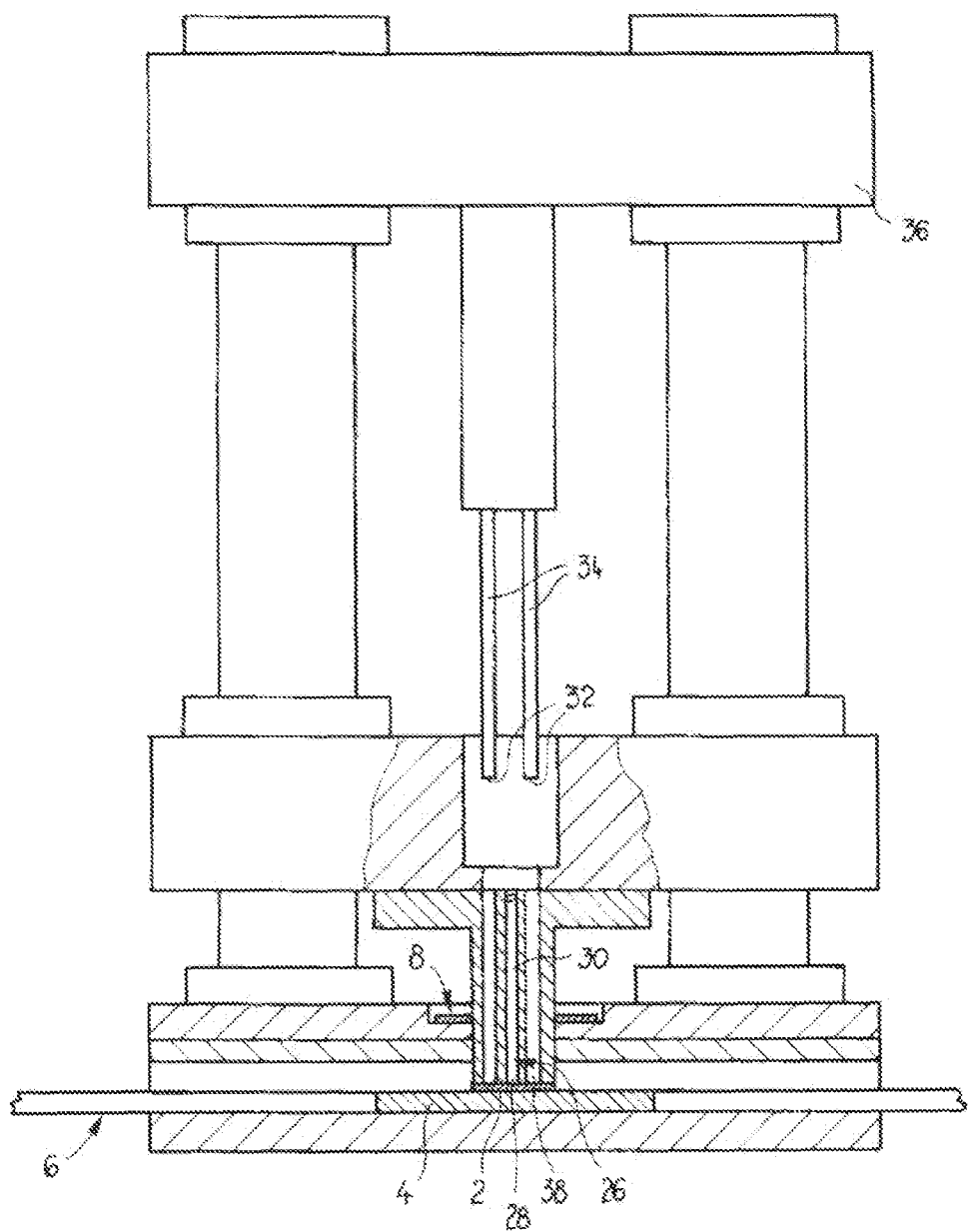
FIG. 3 the mounting device according to FIG. 2 during placement and soldering of the RFID chip modules.
Figure 4:
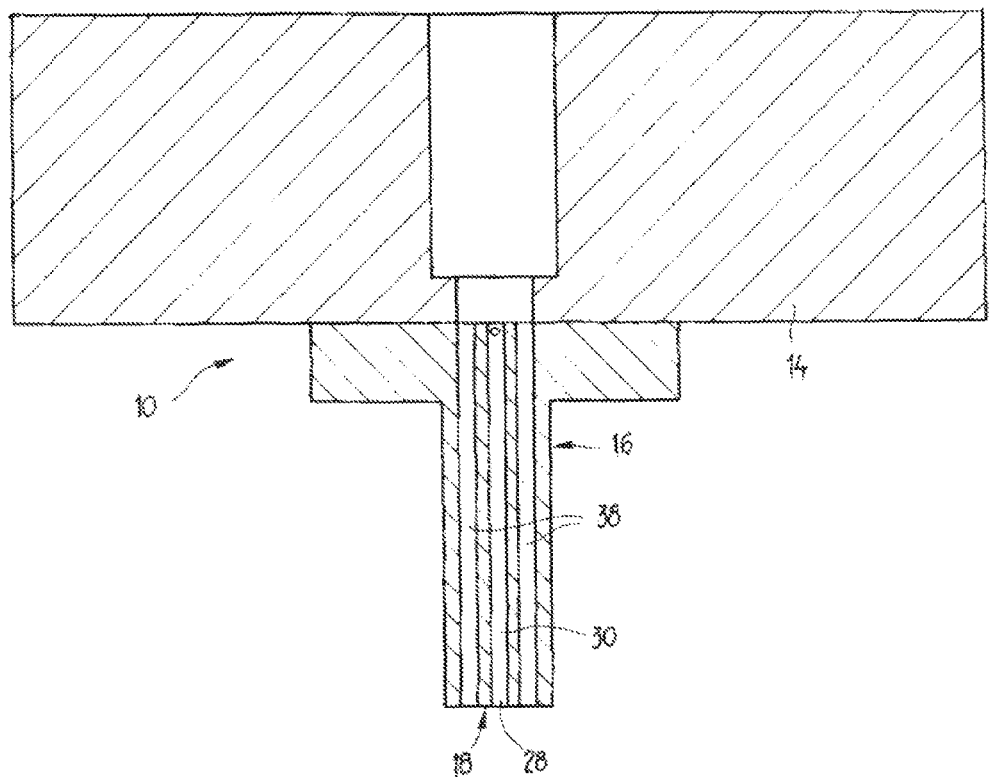
FIG. 4 the punching die of the mounting device, in detail.

FIGS. 1 to 4 show a device for mounting an RFID chip module 2 onto a substrate 4 in the form of a label, wherein the substrate 4 is supplied in the form of a substrate tape 6 and the RFID chip modules 2 are supplied in the form of a carrier tape 8 to a punching device 10. The latter each time punches out an RFID chip module 2 from the carrier tape 8 and delivers the chip module 2 directly to a substrate 4 arranged underneath. The punching device 10 is combined with a heating device 12 that connects the RFID chip module 2 already provided with soldering means to conductors, particularly antenna conductors, arranged at the substrate 4 by melting the soldering means. The soldering means present at the RFID chip module 2 and the conductor, particularly an antenna conductor, arranged on the substrate 4 are not shown.

The punching device 10 comprises a punching die 16 arranged at a displaceable carrying plate 14, the punching side 18 of the punching die facing a punching aperture 20 of a punching matrix 22. The carrier tape 8 lies on top of the punching matrix 22 and is delivered in such manner that the RFID chip module 2 to be punched out is positionally accurately located at the punching aperture 20. A driving device not shown here in detail drives the punching die 16 and thereby punches out the RFID chip module through the punching aperture 20 towards and against the substrate 4 that is positionally accurately arranged onto a support 24 below the punching aperture 20. The positionally accurate delivery of the carrier tape 8 with the RFID chip modules 2 and of the substrate tape 6 with the substrates 4 could be performed manually in principle, but it is more convenient to have guides and delivery devices that are controlled by control means in accordance with the embodiment of the substrate and of the RFID chip modules.

In order to avoid uncontrolled dropping of the RFID chip module being punched out, the punching device 10 is equipped with a suction device 26 that holds the RFID chip module 2 at the punching side 18 thereof from punching out until attachment to the substrate 4. For this purpose, in the present example, there is at least one suction aperture 28 which is arranged at the punching side and is connected in a manner not shown here through a suction channel 30 in the punching die 16 with an underpressure device. The underpressure at the suction aperture is applied when punching out the RFID chip module and is turned off after connection thereof to the substrate.

The heating device 12 combined with the punching device 10 comprises hot spots 32 at the punching side 18 of the punching die 16, which hotspots are assigned to the soldering points, whereby the heat supply can be accomplished with various methods and means (laser, heating cartridge etc.). In the present example, the hot spots 32 are formed preferably by means of heating elements (thermodes) 34 that are arranged on a support 36 which is displaceable by means of driving means not shown in detail here. After punching out the RFID chip module 2 and depositing the same onto the substrate 4, the heating elements 34 are brought into contact with the RFID chip module 2 through guide channels 38 in the punching die 16 for the purpose of melting the soldering means at the RFID chip module and for connecting the connections thereof to the conductor threads of the substrate 4. After melting the soldering means, the heating elements 34 are drawn back and the punching die 16 remains at the RFID chip module 2 until the soldering means have solidified so as to prevent detachment thereof Subsequently, the punching die 16 moves back to its starting position. It is particularly advantageous for the heating device to comprise a laser device which sends a laser beam through the respective guide channels onto the corresponding soldering point of the RFID chip module. The laser device allows for an improved control of the soldering process in thermal and temporal terms.

The substrate can be, for example, a stripe made of paper, plastic or textile material. The conductor can be connected to the corresponding substrate by printing, stitching or, particularly, by weaving into or knitting. In particular, the substrate is a label.

LIST OF REFERENCE NUMERALS

2 RFID chip module
4 substrate
6 substrate tape
8 carrier tape
10 punching device
12 heating device
14 carrying plate
16 punching die
18 punching side
20 punching aperture
22 punching matrix
24 support
26 suction device
28 suction aperture
30 suction channel
32 hot spot
34 heating element
36 support
38 guide channel

The invention claimed is:

1. A mounting device for attaching an RFID chip module with at least one electrical connection to a substrate with at least one conductor, particularly onto a label, said mounting device comprising:
   a punching device for punching out the RFID chip module from a carrier tape with a plurality of chip modules, wherein the punching device comprises a punching matrix with a punching aperture for positionally accurately receiving an RFID chip module to be punched out and a punching die arranged above the punching aperture, wherein under the punching opening there is disposed a support for positionally accurately receiving a substrate and wherein the punching die is displaceable towards and against the substrate;
   a suction device for holding the RFID chip module to the punching die and;
   a heating device for melting any soldering means present on the RFID chip module for producing a conductive connection between each of an electrical connection of the RFID chip module and a respective conductor of the substrate.

2. The mounting device according to claim 1, wherein the suction device comprises suction means for forming an underpressure at least at one point of the punching side of the punching die.

3. The mounting device according to claim 2, wherein the heating device comprises thermodes configured to be fed towards the soldering area and retracted therefrom through guide channels formed in the punching die.

4. The mounting device according to claim 2, wherein the heating device comprises a laser device which comprises, respectively, a laser beam source directed onto the location of the RFID chip module to be soldered.

5. The mounting device according to claim 2, wherein the suction means comprise a punching aperture arranged at the punching side of the punching die for applying the underpressure.

6. The mounting device according to claim 5, wherein the heating device comprises thermodes configured to be fed towards the soldering area and retracted therefrom through guide channels formed in the punching die.

7. The mounting device according to claim 5, wherein the heating device comprises a laser device which comprises, respectively, a laser beam source directed onto the location of the RFID chip module to be soldered.

8. The mounting device according to claim 5, wherein the punching aperture is connected with an underpressure supply by means of a suction channel extending through the punching die.

9. The mounting device according to claim 8, wherein the heating device comprises thermodes configured to be fed towards the soldering area and retracted therefrom through guide channels formed in the punching die.

10. The mounting device according to claim 8, wherein the heating device comprises a laser device which comprises, respectively, a laser beam source directed onto the location of the RFID chip module to be soldered.

11. The mounting device according to claim 1, wherein the heating device comprises thermodes configured to be fed towards the soldering area and retracted therefrom through guide channels formed in the punching die.

12. The mounting device according to claim 11, wherein the thermodes are supplied with heat by means of a laser beam source or a heating cartridge.

13. The mounting device according to claim 1, wherein the heating device comprises a laser device which comprises, respectively, a laser beam source directed onto the location of the RFID chip module to be soldered.

* * * * *